(12) United States Patent
Kuo et al.

(10) Patent No.: US 8,823,169 B2
(45) Date of Patent: Sep. 2, 2014

(54) SEMICONDUCTOR MANUFACTURING METHOD AND SEMICONDUCTOR STRUCTURE THEREOF

(71) Applicant: Chipbond Technology Corporation, Hsinchu (TW)

(72) Inventors: Chih-Ming Kuo, Hsinchu County (TW); Lung-Hua Ho, Hsinchu (TW); Shih-Chieh Chang, Chiayi County (TW); Chia-Yeh Huang, Hsinchu (TW); Chin-Tang Hsieh, Kaohsiung (TW)

(73) Assignee: Chipbond Technology Corporation, Hsinchu (TW)

( * ) Notice: Subject to any disclaimer, the term of this patent is extended or adjusted under 35 U.S.C. 154(b) by 36 days.

(21) Appl. No.: 13/644,749

(22) Filed: Oct. 4, 2012

(65) Prior Publication Data

US 2014/0021601 A1 Jan. 23, 2014

(30) Foreign Application Priority Data

Jul. 18, 2012 (TW) .............................. 101125709 A

(51) Int. Cl.
*H01L 23/48* (2006.01)
*H01L 23/52* (2006.01)
(52) U.S. Cl.
CPC ..................................... *H01L 23/48* (2013.01)
USPC ........... 257/737; 257/738; 257/750; 257/686; 438/613

(58) Field of Classification Search
CPC ....... H01L 21/56; H01L 23/48; H01L 23/488; H01L 24/06; H01L 23/485; H01L 23/52; H01L 24/17; H01L 21/78; H01L 23/49548; H01L 21/44; H01L 21/60; H01L 21/02
USPC .................. 257/737–738, 750, 686, E23.021, 257/E21.508; 438/613–614
See application file for complete search history.

(56) References Cited

U.S. PATENT DOCUMENTS

| | | | | |
|---|---|---|---|---|
| 5,134,460 A | * | 7/1992 | Brady et al. ................... | 257/737 |
| 2007/0045869 A1 | * | 3/2007 | Ho et al. ........................ | 257/780 |
| 2012/0007228 A1 | * | 1/2012 | Lu et al. ........................ | 257/692 |

* cited by examiner

*Primary Examiner* — Theresa T Doan
(74) *Attorney, Agent, or Firm* — Jackson IPG PLLC

(57) ABSTRACT

A semiconductor manufacturing method includes providing a carrier; forming a first photoresist layer; forming plural core portions; removing the first photoresist layer; forming a second photoresist layer; forming a plurality of connection portions, each of the plurality of connection portions includes a first connection layer and a second connection layer and connects to each of the core portions to form a hybrid bump, wherein each of the first connection layers comprises a base portion, a projecting portion and an accommodating space, each base portion comprises an upper surface, each projecting portion is protruded to the upper surface and located on top of each core portion, each accommodating space is located outside each projecting portion, the second connection layers cover the projecting portions and the upper surfaces, and the accommodating spaces are filled by the second connection layers; removing the second photoresist layer to reveal the hybrid bumps.

8 Claims, 10 Drawing Sheets

SEMICONDUCTOR MANUFACTURING METHOD AND SEMICONDUCTOR STRUCTURE THEREOF

FIELD OF THE INVENTION

The present invention is generally related to a semiconductor manufacturing method, which particularly relates to the semiconductor manufacturing method for raising package reliability.

BACKGROUND OF THE INVENTION

A conventional package structure 200 as illustrated in FIG. 6 includes a substrate 210, a chip 220 and a plurality of solders 230, wherein the substrate 210 comprises a plurality of connection pads 211, and the chip 220 comprises a plurality of bumps 221. The solders 230 are applied to the bumps 221. The substrate 210 and the chip 220 are both laminated to make the bumps 221 electrically connected to the connection pads 211 via the solders 230. With the volume of present electronic products going into miniaturization, the spacing between each bump 221 and each connection pad 211 becomes relatively miniaturized. In this condition, the solders 230 likely flow to adjacent bump 221 or adjacent connection pad 211 to lead short phenomenon in the process of reflowing therefore lowering product yield rate.

SUMMARY

The primary object of the present invention is to provide a semiconductor manufacturing method including the following steps of: providing a carrier having a surface and a metallic layer formed on the surface, the metallic layer comprises a plurality of first areas and a plurality of second areas located outside the first areas; forming a first photoresist layer on the metallic layer, the first photoresist layer comprises a plurality of first openings; forming a plurality of core portions in the first openings; removing the first photoresist layer to reveal the core portions, each of the plurality of core portions comprises a top surface; forming a second photoresist layer on the metallic layer, the second photoresist layer comprises a plurality of second openings, and the top surfaces of the core portions are revealed by the second openings; forming a plurality of connection portions in the second openings, each of the plurality of connection portions includes a first connection layer and a second connection layer, each of the first connection layers is formed on the top surface of each of the core portions and the metallic layer to make each of the connection portions connected to each of the core portions to form a hybrid bump, wherein each of the first connection layers comprises a base portion, a projecting portion and an accommodating space, each of the base portions comprises an upper surface, each of the projecting portions is protruded to the upper surface and located on top of each of the core portions, each of the accommodating spaces is located outside each of the projecting portions, the second connection layers cover the projecting portions and the upper surfaces, and the accommodating spaces are filled by the second connection layers; removing the second photoresist layer to reveal the hybrid bumps; and removing the second areas of the metallic layer to make the first areas of the metallic layer form a plurality of under bump metallurgy layers. Owning to the first connection layers having the accommodating spaces, the accommodating spaces can be filled by the second connection layers therefore preventing the second connection layers from overflowing to adjacent hybrid bumps to avoid short phenomenon.

DETAILED DESCRIPTION OF THE INVENTION

Figure 1:
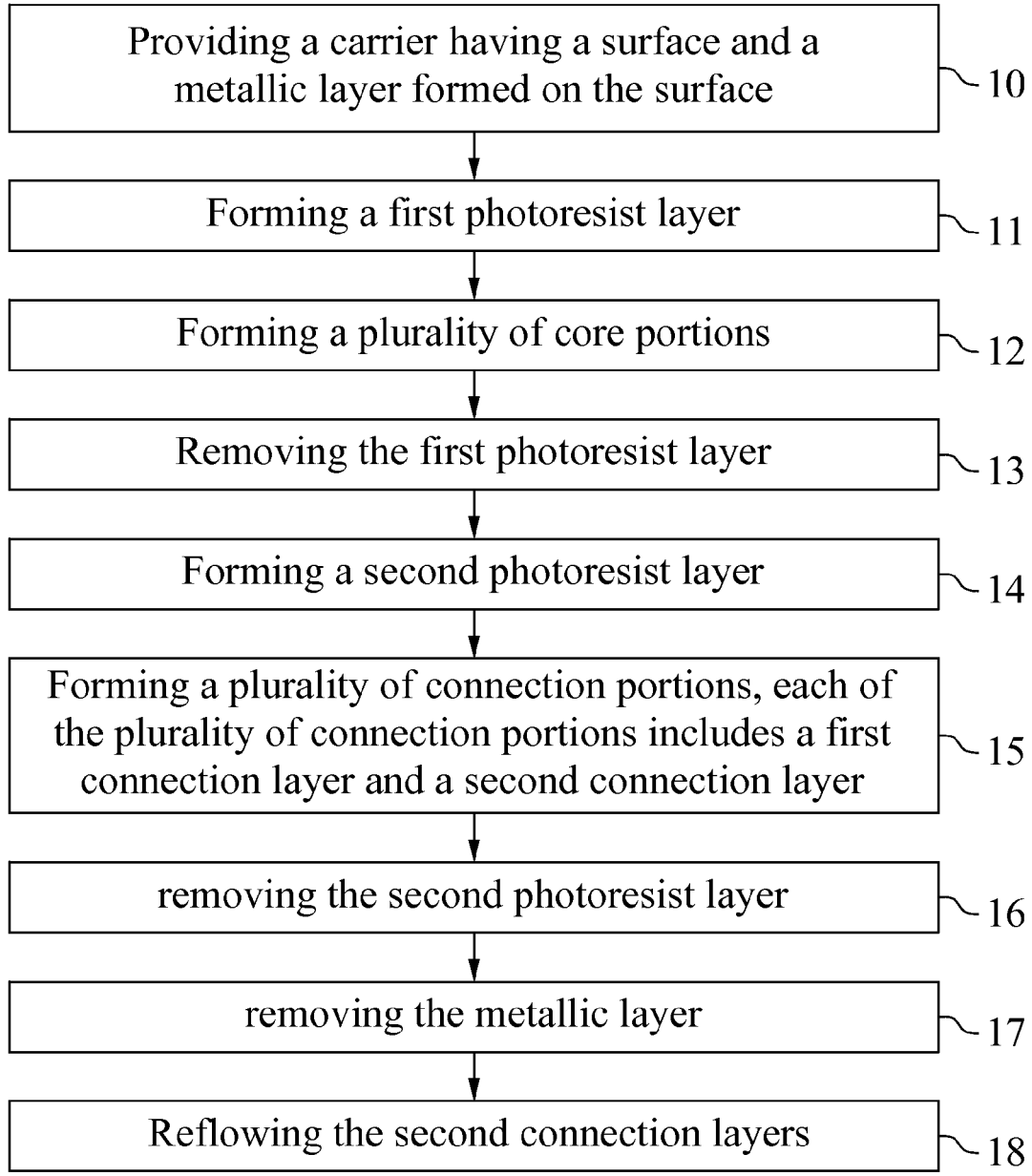
FIG. 1 is a manufacturing flow chart illustrating a semiconductor manufacturing method in accordance with a first embodiment of the present invention.
Figure 2A:
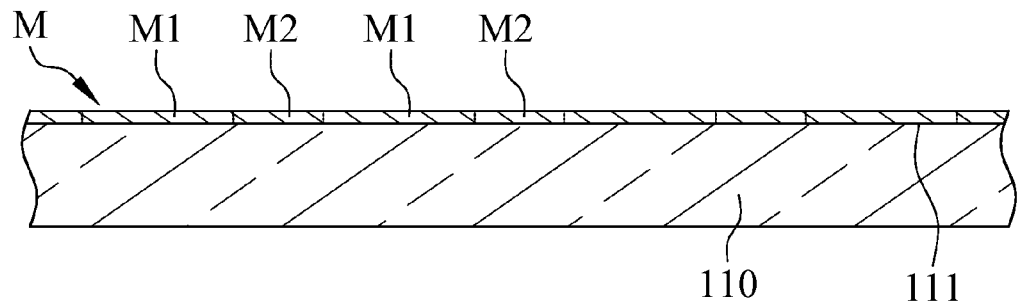
FIGS. 2A to 2I are cross-section diagrams illustrating the semiconductor manufacturing method in accordance with the first embodiment of the present invention.
Figure 2B:
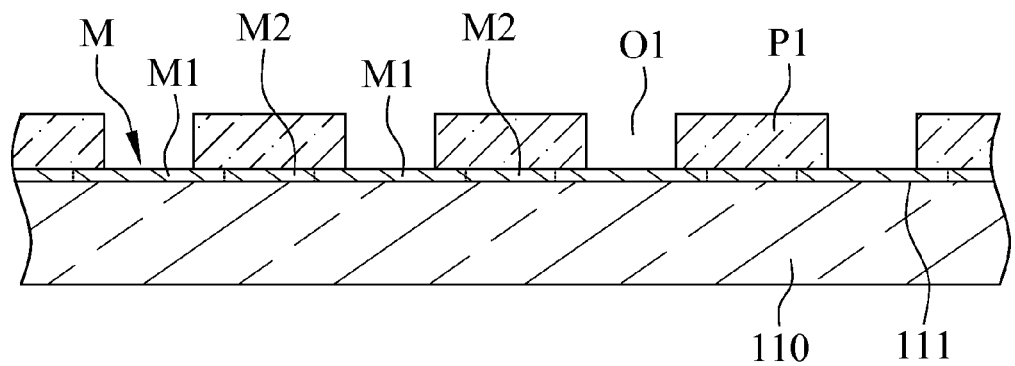
Figure 2C:
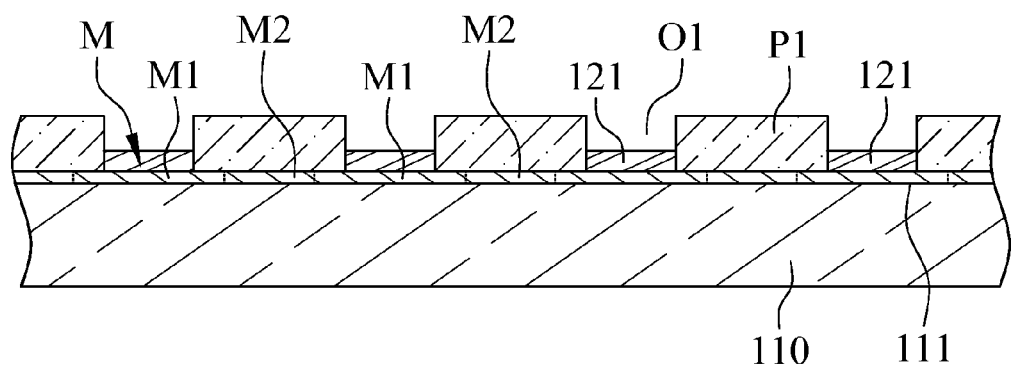
Figure 2D:
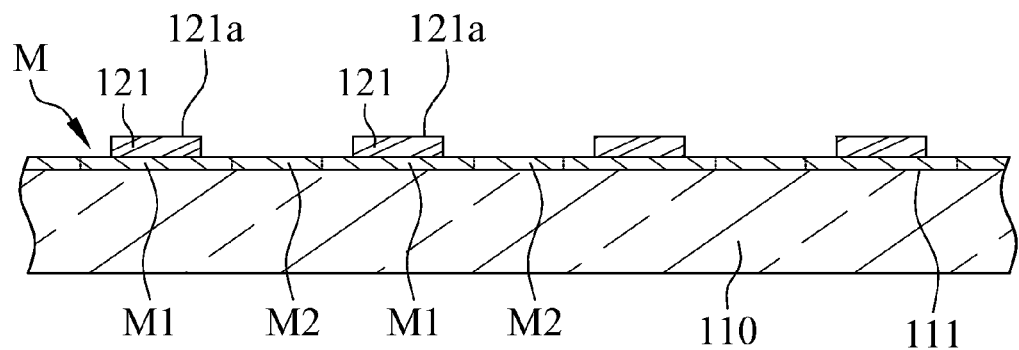
Figure 2E:
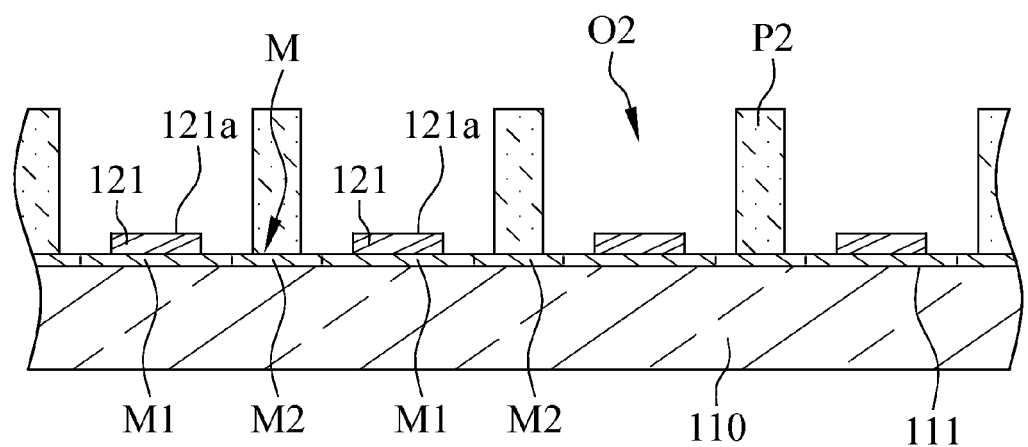
Figure 2F:
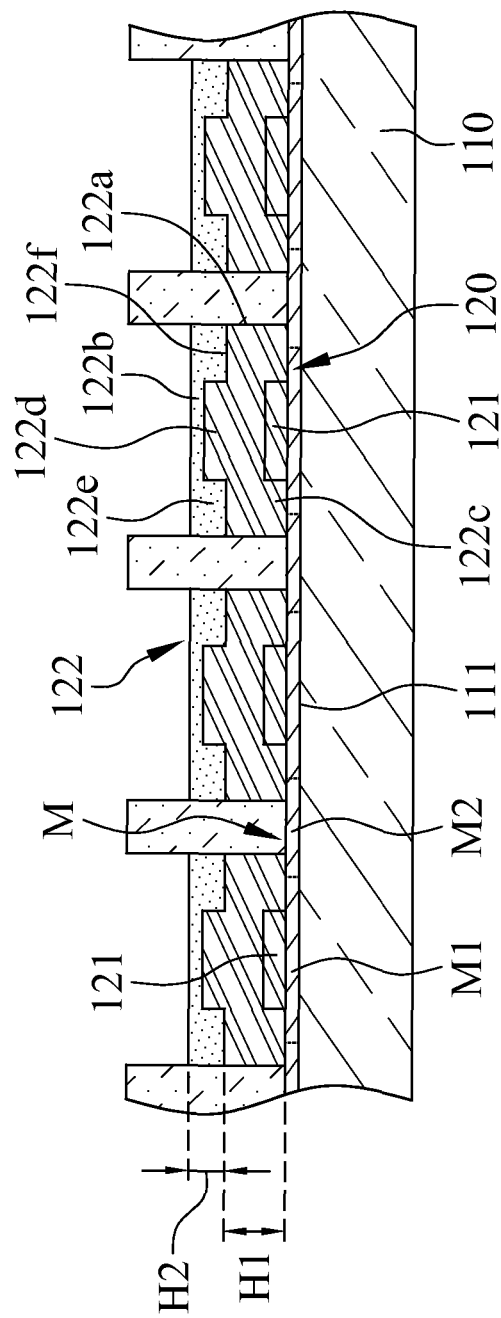

With reference to FIGS. 1 and 2A to 2I, a semiconductor manufacturing method in accordance with a first embodiment of the present invention includes the steps of: first, referring to step 10 of FIG. 1 and FIG. 2A, providing a carrier 110 having a surface 111 and a metallic layer M formed on the surface 111, the metallic layer M comprises a plurality of first areas M1 and a plurality of second areas M2 located outside the first areas M1; next, referring to step 11 of FIG. 1 and FIG. 2B, forming a first photoresist layer P1 on the metallic layer M, the first photoresist layer P1 comprises a plurality of first openings O1; thereafter, referring to step 12 of FIG. 1 and FIG. 2C, forming a plurality of core portions 121 in the first openings O1; afterwards, referring to step 13 of FIG. 1 and FIG. 2D, removing the first photoresist layer P1 to reveal the core portions 121, each of the plurality of core portions 121 comprises a top surface 121a; after that, referring to step 14 of FIG. 1 and FIG. 2E, forming a second photoresist layer P2 on the metallic layer M, the second photoresist layer P2 comprises a plurality of second openings O2 that reveal the top surfaces 121a of the core portions 121; next, referring to step 15 of FIG. 1 and FIG. 2F, forming a plurality of connection portions 122 in the second openings O2, each of the plurality of connection portions 122 includes a first connection layer 122a and a second connection layer 122b, each of the first connection layers 122a is formed on the top surface 121a of each of the core portions 121 and the metallic layer M so as to make each of the plurality of connection portions 122 connected to each of the core portions 121 to form a hybrid bump 120, wherein each of the first connection layers 122a comprises a base portion 122c, a protruding portion 122d and an accommodating space 122e, each of the base portions 122c comprises an upper surface 122f, each of the protruding portions 122d is protruded to the upper surface 122f and located on top of each of the core portions 121, each of the accommodating spaces 122e is located outside each of the protruding portions 122d, the second connection layers 122b cover the protruding portions 122d and the upper surfaces 122f, and the accommodating spaces 122e are filled by the second connection layers 122b, in this embodiment, each of the base portions 122c comprises a first height H1, each of the second connection layers 122b comprises a second height H2, and the first height H1 is not smaller than the second height H2, besides, the material of the first connection layers 122a is selected from one of copper and gold, and the material of the second connection layers 122b is solder.

Figure 2G:
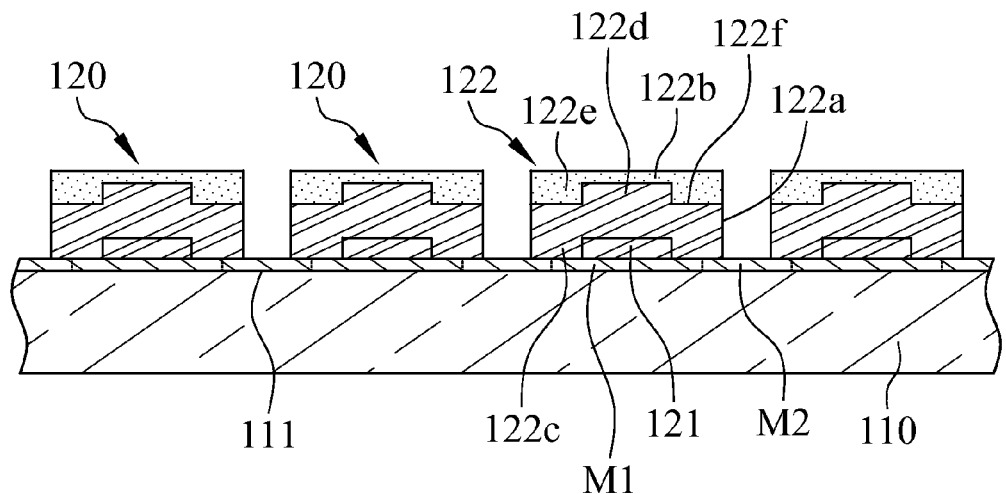
Figure 2H:
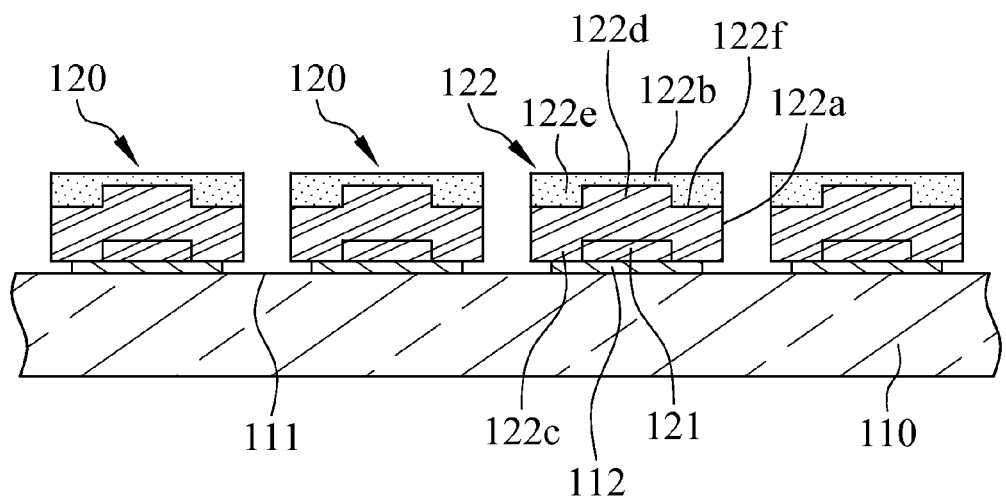
Figure 2I:
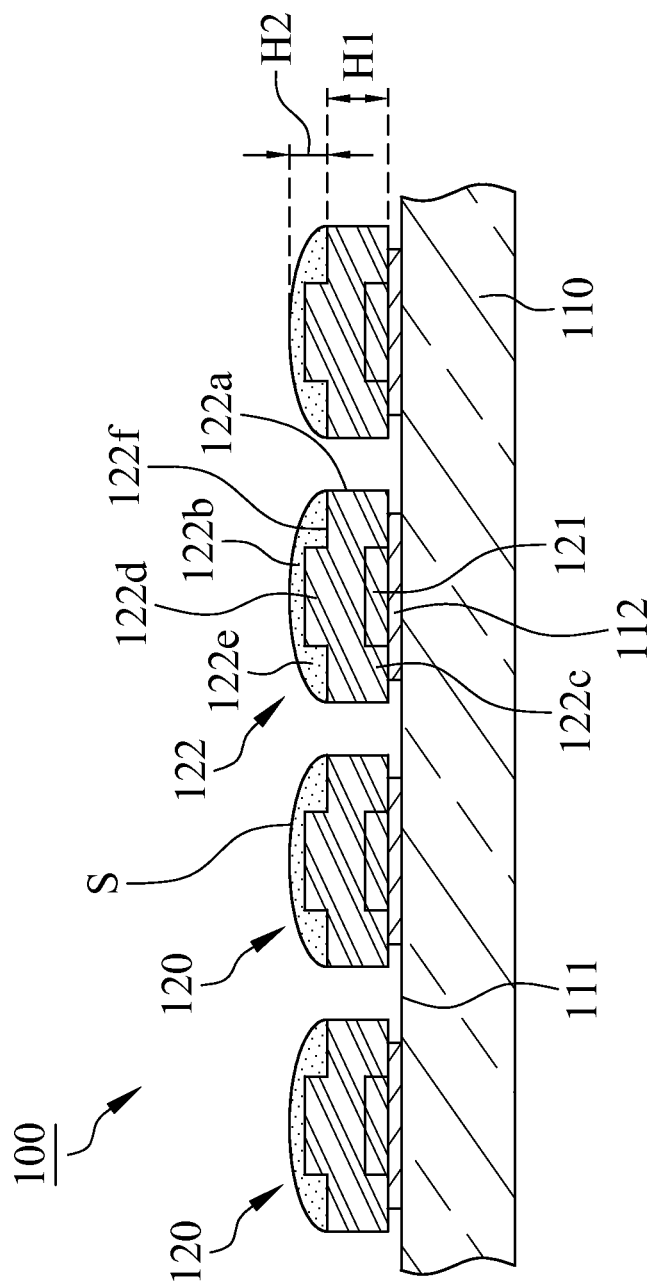

Thereafter, referring to step 16 of FIG. 1 and FIG. 2G, removing the second photoresist layer P2 to reveal the hybrid bumps 120; next, referring to step 17 of FIG. 1 and FIG. 2H, removing the second areas M2 of the metallic layer M to make the first areas M1 of the metallic layer M form a plurality of under bump metallurgy layers 112, wherein the material of the under bump metallurgy layers 112 is selected from one of titanium/copper and titanium tungsten/copper; eventually, referring to step 18 of FIG. 1 and FIG. 2I, reflowing the second connection layers 122b to make said second connection layer 122b form an arc-shaped surface S therefore forming a semiconductor structure 100, still, the second connection layers 122b cover the protruding portions 122d and the upper surfaces 122f, and the accommodating spaces 122e are filled by the second connection layers 122b. Owning to the first connection portions 122a having the base portions 122c, the protruding portions 122d and the accommodating spaces 122e, when the semiconductor structure 100 is laminated onto a substrate (not shown in Figs.), the second connection layers 122b are forced to move outwardly and fill the accommodating spaces 122e therefore preventing the second connection layers 122b from overflowing to adjacent hybrid bumps 120 to avoid short phenomenon.

Figure 3:
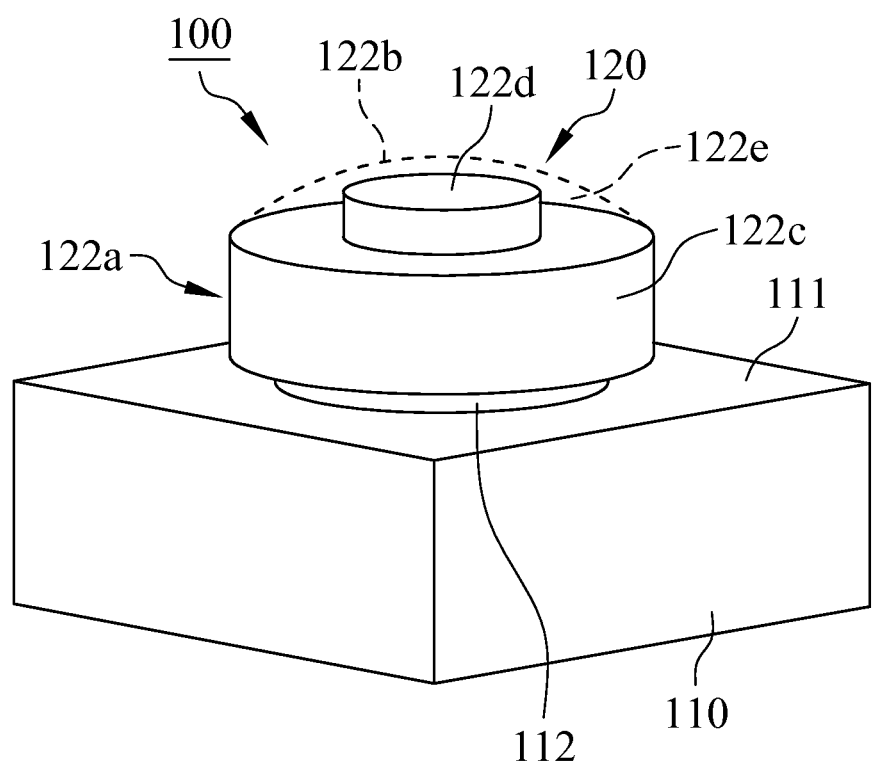
FIG. 3 is a perspective diagram illustrating a semiconductor structure in accordance with the first embodiment of the present invention.

With reference to FIGS. 2I and 3, a semiconductor structure 100 in accordance with the first embodiment of the present invention includes a carrier 110 and a plurality of hybrid bumps 120. The carrier 110 comprises a surface 111 and a plurality of under bump metallurgy layers 112 formed on the surface 111, wherein the material of the under bump metallurgy layers 112 is selected from one of titanium/copper and titanium tungsten/copper. The hybrid bumps 120 are formed on the under bump metallurgy layers 112. Each of the plurality of hybrid bumps 120 comprises a core portion 121 and a connection portion 122, the core portion 121 comprises a top surface 121a, and the connection portion 122 includes a first connection layer 122a and a second connection layer 122b. The material of the first connection layers 122a is selected from one of copper and gold, and the material of the second connection layers 122b is solder. The first connection layer 122a is formed on the top surface 121a of the core portion 121 and the under bump metallurgy layer 112. The first connection layer 122a comprises a base portion 122c, a projecting portion 122d and an accommodating space 122e, the base portion 122c comprises an upper surface 122f and a first height H1, the projecting portion 122d is protruded to the upper surface 122f and located on top of the core portion 121, the accommodating space 122e is located outside the projecting portion 122d, the second connection layer 122b covers the projecting portion 122d and the upper surface 122f, and the accommodating space 122e is filled by the second connection layer 122b. The second connection layer 122b comprises a second height H2, and the first height is not smaller than the second height H2.

Figure 4:
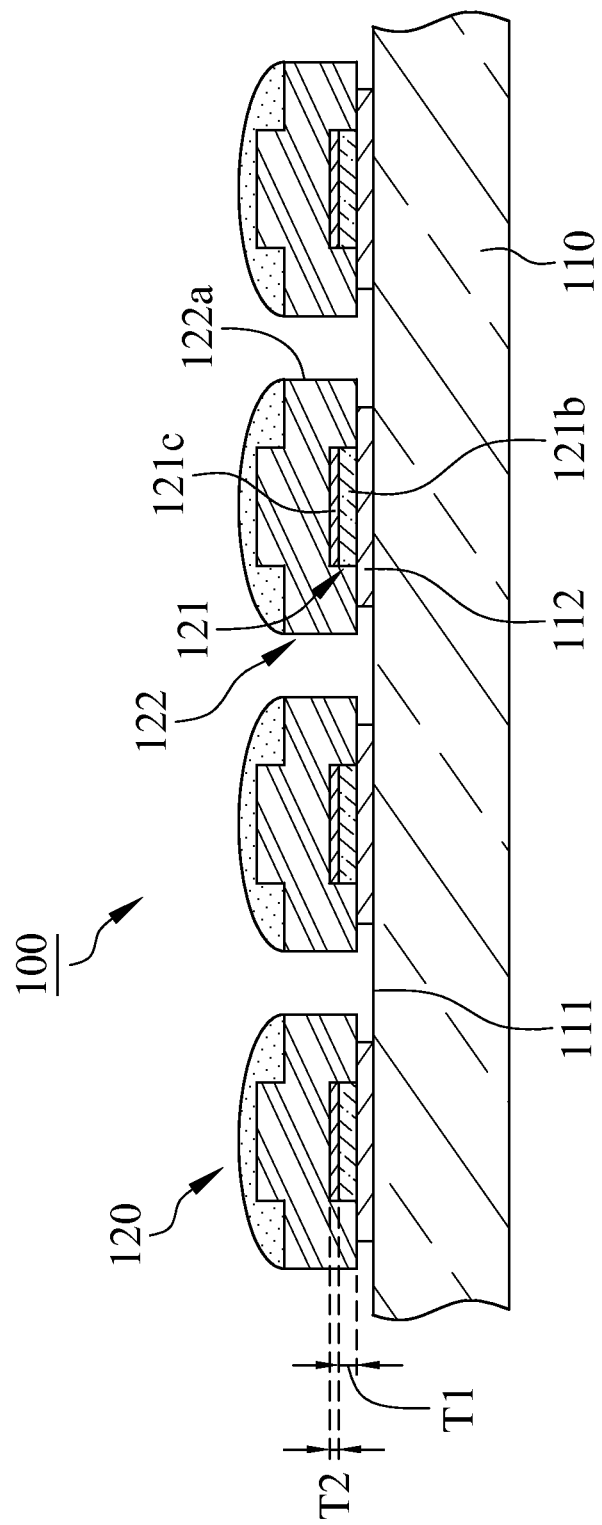
FIG. 4 is a cross-section diagram illustrating the semiconductor structure in accordance with a second embodiment of the present invention.

Or referring to FIG. 4, a semiconductor structure 100 in accordance with a second embodiment of the present invention at least includes a carrier 110 and a plurality of hybrid bumps 120. The carrier 110 comprises a surface 111 and a plurality of under bump metallurgy layers 112 formed on the surface 111. The hybrid bumps 120 are formed on the under bump metallurgy layers 112. Each of the plurality of hybrid bumps 120 comprises a core portion 121 and a connection portion 122. The primary difference between the second embodiment and the first embodiment is that each of the core portions 121 further comprises a first core layer 121b and a second core layer 121c located between each of the first core layers 121b and each of the first connection layers 122a. The first core layer 121b comprises a first thickness T1, the second core layer 121c comprises a second thickness T2, and the first thickness T1 is larger than the second thickness T2. The material of the first core layers 121b is copper, and the material of the second core layers 121c is nickel. As long as the material of the first connection layers 122a is gold and the material of the first core layers 121b is copper, the coupling strength between the first connection layer 122a and the first core layer 121b effectively increases owning to the material of the second core layer 121c is nickel.

Figure 5:
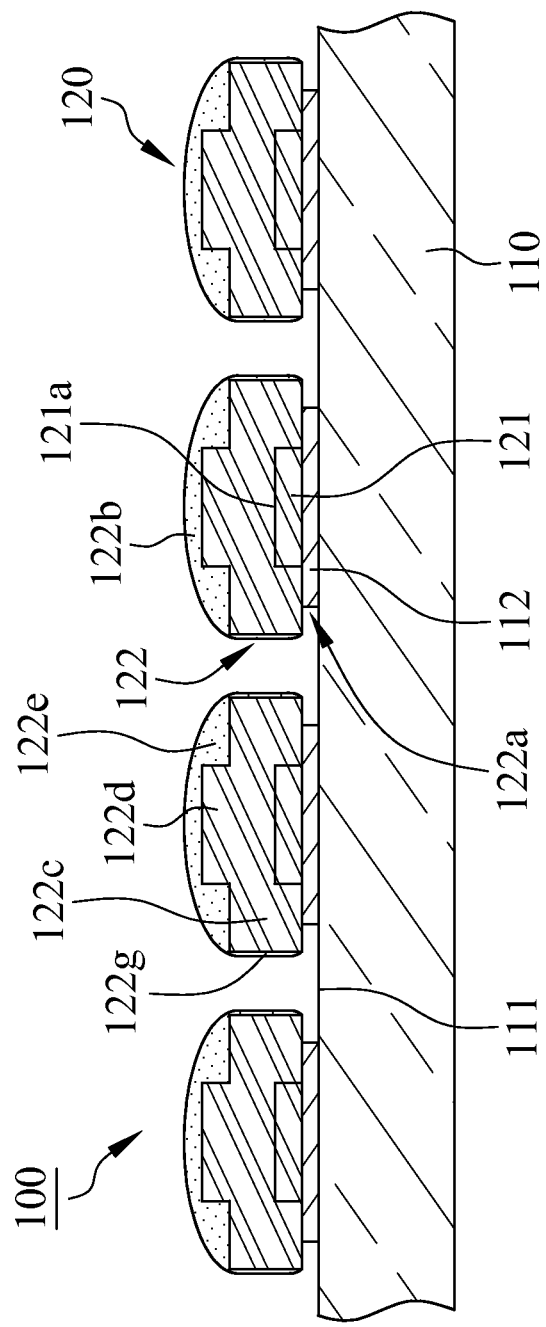
FIG. 5 is a cross-section diagram illustrating the semiconductor structure in accordance with a third embodiment of the present invention.
Figure 6:
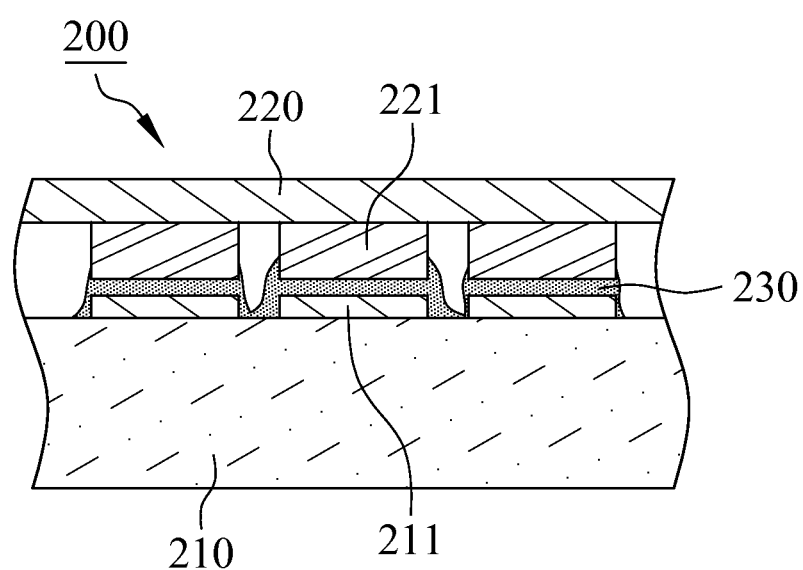
FIG. 6 is a schematic diagram illustrating a conventional semiconductor structure.

With reference to FIG. 5, a semiconductor structure 100 in accordance with a third embodiment of the present invention at least includes a carrier 110 and a plurality of hybrid bumps 120. The carrier 110 comprises a surface 111 and a plurality of under bump metallurgy layers 112 formed on the surface. The hybrid bumps 120 are formed on the under bump metallurgy layers 112. Each of the plurality of hybrid bumps 120 comprises a core portion 121 and a connection portion 122, the core portion 121 comprises a top surface 121a, and the connection portion 122 includes a first connection layer 122a and a second connection layer 122b. The first connection layer 122a is formed on the top surface 121a of the core portion 121 and the under bump metallurgy layer 112 and comprises a base portion 122c, a protruding portion 122d and an accommodating space 122e. In this embodiment, the primary difference between the third embodiment and the first embodiment is that the base portion 122c further comprises a lateral wall 122g. In the step of reflowing the second connection layers 122b, the second connection layers 122b further cover the lateral walls 122g. When the semiconductor structure 100 is coupled to a substrate (not shown in Figs.), the hybrid bumps 120 of the semiconductor structure 100 and the substrate are difficult to separate from each other owning to the reason that the lateral walls 122g being covered with the second connection layers 122b.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor structure at least includes:
 a carrier having a surface and a plurality of under bump metallurgy layers formed on the surface; and
 a plurality of hybrid bumps formed on the under bump metallurgy layers, wherein each of the plurality of hybrid bumps comprises a core portion and a connection portion, the core portion comprises a top surface, the connection portion includes a first connection layer and a second connection layer, the first connection layer is formed on the top surface of the core portion and the under bump metallurgy layer, wherein the first connection layer comprises a base portion, a projecting portion and an accommodating space formed by the first connection layer on the to of the core portion, the base portion comprises an upper surface, the projecting portion is protruded to the upper surface and located on top of the core portion, the accommodating space is located outside the projecting portion, the second connection layer covers the projecting portion and the upper surface, and the accommodating space is filled by the second connection layer.

2. The semiconductor structure in accordance with claim 1, wherein each of the base portions comprises a lateral wall covered with the second connection layer.

3. The semiconductor structure in accordance with claim 1, wherein each of the core portions comprises a first core layer and a second core layer, the first core layer comprises a first thickness, the second core layer comprises a second thickness, and the first thickness is larger than the second thickness.

4. The semiconductor structure in accordance with claim 3, wherein the material of the first core layer is copper, and the material of the second core layer is nickel.

5. The semiconductor structure in accordance with claim 1, wherein each of the base portions comprises a first height, each of the second connection layers comprises a second height, and the first height is not smaller than the second height.

6. The semiconductor structure in accordance with claim 1, wherein the material of the under bump metallurgy layers is selected from one of titanium/copper and titanium tungsten/copper.

7. The semiconductor structure in accordance with claim 1, wherein the material of the first connection layers is selected from one of copper and gold.

8. The semiconductor structure in accordance with claim 1, wherein the material of the second connection layers is solder.

* * * * *